United States Patent [19]

Tanaka

[11] Patent Number: 5,048,180
[45] Date of Patent: Sep. 17, 1991

[54] METHOD OF BONDING A SEMICONDUCTOR DEVICE WITH A SUBSTRATE

[75] Inventor: Takayoshi Tanaka, Sayama, Japan
[73] Assignee: Casio Computer Co., Ltd., Tokyo, Japan
[21] Appl. No.: 490,049
[22] Filed: Mar. 7, 1990
[30] Foreign Application Priority Data Mar. 14, 1989 [JP] Japan .................... 1-59810

[51] Int. Cl.$^5$ .................... H05K 3/34; B23P 19/00
[52] U.S. Cl. .................... 29/840; 29/740; 228/51; 228/53; 228/180.2
[58] Field of Search .................... 228/51, 53, 54, 180.1, 228/180.2; 29/827, 840, 740

[56] References Cited

U.S. PATENT DOCUMENTS

| | | | |
|---|---|---|---|
| 2,501,616 | 3/1950 | Robinson | 228/54 X |
| 2,679,223 | 5/1954 | Franklin | 228/54 X |
| 3,080,842 | 3/1963 | Rice | 228/54 |
| 3,576,969 | 5/1971 | Surty et al. | 29/827 X |
| 4,667,867 | 5/1987 | Dobbs et al. | 228/54 X |
| 4,871,899 | 10/1989 | Du Frenne | 228/51 X |

FOREIGN PATENT DOCUMENTS 0032437  7/1981  European Pat. Off. ............ 228/54

OTHER PUBLICATIONS

Research Disclosure, Feb. 1988, No. 28657, p. 100.

*Primary Examiner*—Carl J. Arbes
*Attorney, Agent, or Firm*—Frishauf, Holtz, Goodman & Woodward

[57] ABSTRACT

An improved tape automated bonding is disclosed. A heater head employs a heat conducting member and a bonding tip member. The heat conducting member formed of a material, such as molybdenum or tungsten, has a U-shaped contour which comprises a pair of halves and an interconnection for generating bonding heat by undergoing high frequency electric current. The bonding tip member is bonded to the interconnection of the conducting member. The tip member is formed of material, such as diamond or cubic boron nitride, which is higher in resistivity and thermal conductivity than the conducting member.

6 Claims, 2 Drawing Sheets

FIG. 2A

| MATERIAL | ELECTRIC RESISTANCE Ω-cm | THERMAL CONDUCTIVITY W/cm·°C | COEFFICIENT OF THERMAL EXPANSION ×10$^{-6}$/°C |
|---|---|---|---|
| MOLYBDENUM (MO) | $5.7 \times 10^{-6}$ | 1.3 | 5.2 |
| TUNGSTEN (W) | $5.5 \times 10^{-6}$ | 1.6 | 4.5 |

FIG. 2B

| MATERIAL | ELECTRIC RESISTANCE Ω-cm | THERMAL CONDUCTIVITY W/cm·°C | COEFFICIENT OF THERMAL EXPANSION ×10$^{-6}$/°C |
|---|---|---|---|
| NATURAL DIAMOND | $10^{16}$ | 22～5 | 2.3 |
| CBN | $10^{11}$～$10^{12}$ | 6 | 3.7 |

METHOD OF BONDING A SEMICONDUCTOR DEVICE WITH A SUBSTRATE

BACKGROUND OF THE INVENTION

1. Field of the Invention

The present invention relates to an improved tape automated bonding method.

2. Description of the Related Art

Conventional heater heads for use in resistive thermal bonding are designed such that a heater section, which contacts a material to be bonded, is disposed at a lower portion of a metal head having a nearly U shape, and is caused to generate heat in a short period of time due to Joule heat generated by a current supplied thereto, whereby the material to be bonded is heated by the generated heat. As generation of the Joule heat is proportional to an electric resistivity, the material for such a heater head is selected from those having a high electric resistivity in order to improve the heat generating efficiency. In order to provide a uniform heating temperature instantaneously, on the other hand, it is desirable to use a material which has a high thermal conductivity and has such a property that a solder material (e.g., solder) for a material to be bonded is difficult to adhere.

In consideration of the aforementioned electric resistivity, thermal conductivity or adhesiveness, the material for the head is inevitably restricted to molybdenum (Mo), tungsten or the like. As the overall size of the heater is enlarged, there would be a variation in heat generation and heat radiation, thus making it difficult to provide a uniform heating temperature instantaneously (within several seconds) due to the characteristic of the thermal conductivity.

If such a head is used to bond a bump electrode of a semiconductor device to an external connecting lead by a TAB (Tape Automated Bonding) method, therefore, a variation in the heating temperature of a heater section of the head is likely to cause the bump electrode to be separated from the semiconductor device at that portion where the temperature is high and to cause the bump electrode to be separated from the external connecting lead due to insufficient connection therebetween at that portion where a temperature is low. This prevents uniform bonding between the bump electrode and the external connecting lead.

SUMMARY OF THE INVENTION

Accordingly, it is an object of this invention to provide a bonding method which can acquire an instantaneous, uniform heating temperature, apply to simultaneous bonding of semiconductor devices which requires a highly accurate temperature, and ensure accurate bonding between bump electrodes of the semiconductor devices and external connecting leads.

According to this invention, there is provided a method of bonding a semiconductor device with a substrate comprising the steps of:

providing a semiconductor device having electrodes;

providing a substrate having connecting terminals, each of which is correspondingly disposed to the electrodes;

aligning each of the connecting terminals with a corresponding one of the electrodes; and thermocompressing the connecting terminals to the electrodes by a heater head which comprises a conducting member having an edge surface and a bonding piece bonded to the edge surface of the conducting member and having a higher resistivity and thermal conductivity than that of the conducting member.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 2A illustrates the electric and physical characteristic of a supporter that constitutes the head shown in FIG. 1;

FIG. 2B illustrates the electric and physical characteristic of a heater piece that constitutes the head shown in FIG. 1.

DETAILED DESCRIPTION OF THE PREFERRED EMBODIMENTS

A preferred embodiment of this invention will now be described referring to the accompanying drawings.

Figure 1:
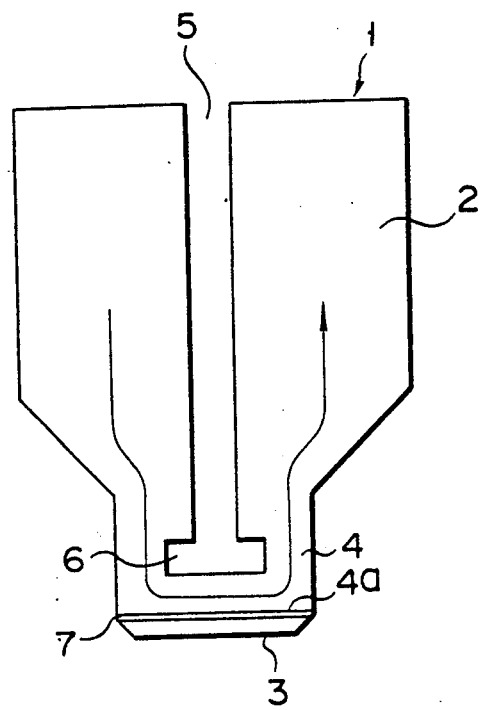
FIG. 1 is a side view illustrating the structure of a head used in the present bonding method.

FIG. 1 illustrates a heater head for thermocompressing for us in the present tape automated bonding. This head 1 has a thermal bonding member 3 bonded at the lower edge of a heat conducting member 2.

The conducting member 2 is formed to have a nearly U-shaped contour and a heater section 4 having a substantially square cross section is formed at its lower portion. The conducting member 2 has a slit 5 formed at the center portion, extending from the top to the center of the heater section 4, and is wider at the center portion than at the lower portion, the heater section 4 being narrower than this diameter of the middle portion of the conducting member 2. The heater section 4 has a hollow portion 6 formed at the center to provide a uniform temperature distribution at its bottom surface 4a. Since the conducting member 2 requires Joule heat to generate heat, a material is used such as molybdenum or tungsten as shown in FIG. 2A which has a high electric resistivity to improve the heat generating efficiency and a high thermal conductivity to provide an instantaneous, uniform heating temperature.

The thermal bonding member 3 is formed to have a thin film with a substantially square plane having the same size as the bottom surface 4a of the heater section 4, and is bonded to the bottom surface of the heater section 4 by an adhesive or a wax material 7 with a lower electric resistance, such as a silver solder or gold solder. This thermal bonding member 3 is made of a material which has a higher electric resistance and a higher thermal conductivity than the conducting member 2, for example, a sintered material, such as a natural diamond or CBN (Cubic Boron Nitride).

FIG. 2B illustrates the electric resistances, thermal conductivities and coefficients of thermal expansion of those materials. According to the thus constituted heater head, when a pulse current (500 to 1000 A) of a predetermined voltage (1.5 to 3 V) flows through the conducting member 2 as shown in the arrow, the heater section 4 is heated by Joule heat. This heat reaches the thermal bonding member 3 connected to the bottom 4a of the heater section 4. Since the thermal bonding member 3 is made of a sintered material such as a natural diamond or CBN having a higher thermal conductivity than the conducting member 2, as mentioned above, the heat generated by the heater section 4 can instantaneously be transferred the entire area of the thermal bonding member 3. This permits the thermal bonding member 3 to have a uniform, predetermined temperature (about 450° C.) instantaneously (about 1 second), thereby ensuring uniform heating of a material to be bonded.

In this case, as is obvious from FIGS. 2A and 2B, the thermal bonding member 3 has a lower coefficient of thermal expansion than molybdenum or tungsten used for the conducting member 2. With this construction, an amount of the deformation at the thermocompressing area with respect to the material to be bonded can be made smaller.

Figure 3:
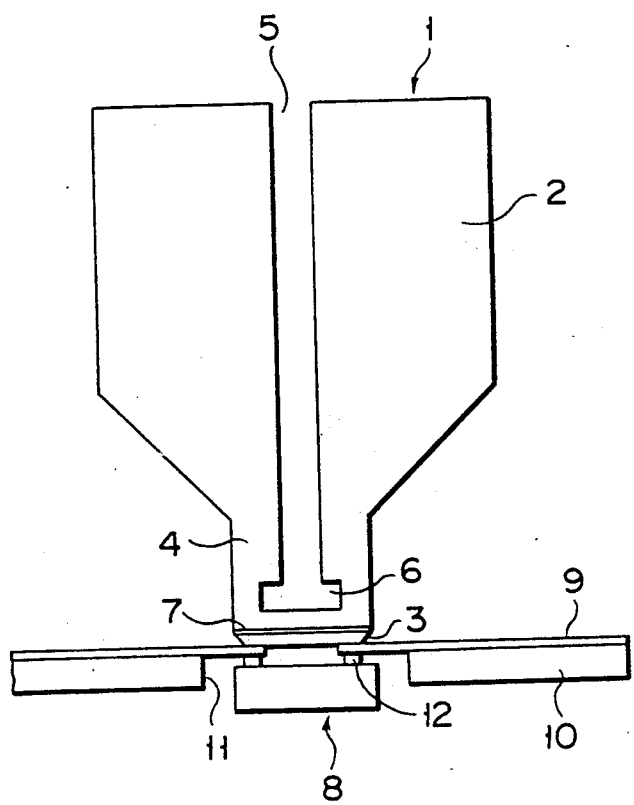
FIG. 3 is a side view illustrating how tape automated bonding is executed using the head shown in FIG. 1.

Referring now to FIG. 3, a description will be given of the bonding method of using the TAB system to bond a semiconductor device 8 with the heater head.

In this case, a resin film 10 with a plurality of connecting leads 9 is provided in advance. This resin film 10, generally called a tape carrier, has a substantially square opening 11 formed at its predetermined position and has the connecting leads 9 formed on its top surface, extending over the opening 11 from the recess. The connecting leads 9 are formed by laminating a copper foil on the top of the resin film 10, subjecting the copper foil to photoetching to provide a lead pattern, then plating a solder, about 1 μm thick, on the surface of the remaining copper foil.

Then, the semiconductor device 8 is inserted in the opening 11 of the resin film 10 from below so that a plurality of bump electrodes 12 formed on the top of the semiconductor device 8 come in association with the connecting leads 9 protruding over the opening 11. As is known, the bump electrodes 12 are formed to protrude over the insulating film formed on the top of the semiconductor device 8. The bump electrodes 12 are made of gold (Au) and are about 25 to 30 μ high.

Under this condition, the heater head 1 is moved down on the connecting leads 9 associated with the semiconductor device 8 from the above, so that the thermal bonding member 3 connected to the bottom of the heater section 4 are pressed against the bump electrodes 12 of the semiconductor device 8 for thermal bonding. The conditions for the thermal bonding in this case are about 450° C. for the temperature of the heater section 4, about 8 kg/cm$^2$ for the pressure bonding force, and about 1 second for the bonding time. The temperature of the heater section 4 in the above conditions means the temperature of a predetermined portion of the heater section, not the averaged temperature or temperature variation. In general, an energizing device for causing the head 1 to generate heat self-controls the energizing condition based on the temperature at the predetermined portion of the head 1. Accordingly, a temperature sensor for the energizing device is secured to the predetermined portion of the head 1 and the temperature detected by this sensor is controlled to be a predetermined level, thereby satisfying the temperature condition for the heater section.

When the bump electrodes 12 of the semiconductor device 8 and the connecting leads 9 are subjected to thermal bonding with the heater head 1, the thermal bonding member 3 of the head 1 compresses and heats the connecting leads 9. This causes the solder plated on the surface of each connecting lead 9 to melt so that the connection leads 9 are bonded to the bump electrodes 12. The thermal bonding member 3 has a substantially uniform temperature distribution at this time, i.e., less variation in temperature all over the member 3. Unlike in the conventional case, therefore, the bump electrodes will not be separated from the semiconductor device 8 at that portion where the temperature is high or the bump electrodes are not insufficiently bonded to connecting leads, thus ensuring uniform and simultaneous bonding of the bump electrodes of the semiconductor device 8 to the connecting leads 9 with high accuracy.

Although a solder is plated on the connecting leads 9 in the above embodiment, this embodiment is not restricted to this particular application; for instance, the bump electrodes 12 of the semiconductor device 8 may be formed of a solder which is caused to melt later to be bonded to the connecting leads.

Additional advantages and modifications will readily occur to those skilled in the art. Therefore, the invention in its broader aspects is not limited to the specific details, representative device, and illustrated examples shown and described herein. Accordingly, various modifications may be made without departing from the spirit or scope of the general inventive concept as defined by the appended claims and their equivalents.

What is claimed is:

1. A method of making an integrated circuit chip unit, comprising the steps of:
   providing a carrier tape which comprises an insulating tape having a device hole and a plurality of leads, each of which leads is mounted on said insulating tape and has one end projecting inside of said device hole;
   providing an integrated circuit chip having a plurality of bump electrodes;
   aligning said one ends of said leads with said bump electrodes of said integrated circuit chip; and
   thermocompressing said one ends of said leads to said bump electrodes by a heater head including a heater conductive portion having a slit at a middle and an interconnection crossing over said slit at only one end of said heater conductive portion, and a bonding tip portion formed on said interconnection of said heater conductive portion;
   said heater conductive portion, including said interconnection, being made of either one of molybdenum and tungsten for generating bonding heat by undergoing high frequency electric current;
   said bonding tip portion having a higher resistivity, higher thermal conductivity and lower coefficient of thermal expansion than those of said heater conductive portion.

2. A method according to claim 1, wherein said bonding tip portion is formed of a natural diamond.

3. A method according to claim 1, wherein said bonding tip portion is formed of a cubic boron nitride.

4. A bonding apparatus for electrically bonding a first contact to a second contact, comprising:

heat conductor means for generating bonding heat by undergoing a high frequency electric current and having a slit at a middle and an interconnection crossed over at only one end of said slit;

said heat conductor means, including said interconnection, being made of one of the materials selected from molybdenum and tungsten with respect to characteristics of resistivity, thermal conductivity and coefficient of thermal expansion; and bonding tip means formed on said interconnection of said heat conductor means for thermocompressing the first contact to the second contact and having a higher resistivity, higher thermal conductivity and lower coefficient of thermal expansion than those of said heat conductor means.

5. A bonding apparatus according to claim 4, wherein said bonding tip means is formed of a natural diamond.

6. A bonding apparatus according to claim 4, wherein said bonding tip means is formed of a cubic boron nitride.

* * * * *